(12) United States Patent
Park (10) Patent No.: US 6,723,595 B2
(45) Date of Patent: Apr. 20, 2004

(54) THIN FILM DEPOSITION METHOD INCLUDING USING ATOMIC LAYER DEPOSITION WITHOUT PURGING BETWEEN INTRODUCING THE GASEOUS REACTANTS

(75) Inventor: Chang-Boo Park, Seoul (KR)

(73) Assignee: Jusung Engineering Co., Ltd. (KR)

( * ) Notice: Subject to any disclaimer, the term of this patent is extended or adjusted under 35 U.S.C. 154(b) by 0 days.

(21) Appl. No.: 10/061,704

(22) Filed: Feb. 1, 2002

(65) Prior Publication Data

US 2002/0160585 A1 Oct. 31, 2002

(30) Foreign Application Priority Data

Feb. 2, 2001 (KR) .......................................... 2001-5043

(51) Int. Cl.⁷ ................. H01L 21/8283; H01L 21/8242; H01L 21/31; H01L 21/469
(52) U.S. Cl. ..................... 438/216; 438/240; 438/765; 438/776; 438/784
(58) Field of Search ................. 438/765, 776, 438/784, 240, 216

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,767,494 A | 8/1988 | Kobayashi et al. | 117/93 |
| 5,130,269 A | 7/1992 | Kitahara et al. | 437/111 |
| 5,661,115 A | 8/1997 | Sandhu | 427/534 |
| 5,879,459 A | 3/1999 | Gadgil et al. | 118/715 |
| 5,916,365 A | 6/1999 | Sherman | 117/92 |
| 6,010,940 A | * 1/2000 | Lee et al. | 438/396 |
| 6,015,590 A | 1/2000 | Suntola et al. | 427/255 |
| 6,042,652 A | 3/2000 | Hyun et al. | 118/719 |
| 6,124,158 A | * 9/2000 | Dautartas et al. | 438/216 |

OTHER PUBLICATIONS

"Applied Physics Letters"—vol. 71, No. 25, pp. 3604–3606, Dec. 22, 1997.

* cited by examiner

Primary Examiner—W. David Coleman
Assistant Examiner—William M. Brewster
(74) Attorney, Agent, or Firm—Duane Morris LLP (57) ABSTRACT

The present invention discloses a method of fabricating a thin film in a chamber where a heater and a suscepter are located. The method includes the steps of disposing an object on the susceptor so as to form the thin film thereon; heating the object; a first sub-step of introducing a first gaseous reactant into the first chamber such that the first gaseous reactant is absorbed on the object to form an absorption layer; a second sub-step of introducing a second gaseous reactant into the first chamber such that the second gaseous reactant reacts with the absorption layer absorbed on the object; and a third sub-step of introducing a reducing gas into the first camber such that the reducing gas reduces by-products and impurities of the first and second gaseous reactants.

19 Claims, 5 Drawing Sheets

THIN FILM DEPOSITION METHOD INCLUDING USING ATOMIC LAYER DEPOSITION WITHOUT PURGING BETWEEN INTRODUCING THE GASEOUS REACTANTS

This application claims the benefit of Korean Patent Applications No. 2001-5043 filed on Feb. 2, 2001, which is hereby incorporated by reference as if fully set forth herein.

BACKGROUND OF THE INVENTION

1. Field of the Invention

The present invention relates to a method for performing Chemical Vapor Deposition (CVD), and more particularly to Atomic Layer Deposition (AID) Processes.

2. Discussion of the Related Art

In the field of thin film technology requirements for thinner deposition layers, better uniformity over increasingly larger area substrates, larger production yields, and higher productivity have been driving forces behind emerging technologies developed by equipment manufactures for coating substrates in the manufacturing of various semiconductor devices.

Electric devices are recently highly integrated to have smaller size and light weight because of semiconductor devices. Specifically, the manufacture of Ultra Large Scale Integration is possible due to the improved thin film deposition technologies manufacturing the semiconductor devices.

Namely, process control and uniform film deposition achieved in the production of a microprocessor can be achieved. These same factors in combination with new materials also dictate higher packing densities for memories that are available on a single chip or device. As these devices become smaller, the need for greater uniformity and process control regarding layer thickness rises dramatically.

Various technologies well known in the art exist for applying thin films to substrates or other substrates in manufacturing steps for integrated circuits (ICs). Among the more established technologies available for applying thin films, Chemical Vapor Deposition (CVD) is an often-used and commercialized process. Atomic Layer Deposition (ALD), a variant of CVD, is a relatively new technology now emerging as a potentially superior method for achieving uniformity, excellent step coverage, and transparency to substrate size. ALD, however, exhibits a generally lower deposition rate than CVD.

CVD is flux-dependent application requiring specific and uniform substrate temperature and precursors (chemical species) to be in a state of uniformity in the process chamber in order to produce a desired layer of uniform thickness on a substrate surface. These requirements becomes more critical as substrate size increases, creating a need for more complexity in chamber design and gas flow technique to maintain adequate uniformity.

In the CVD method alluded above, deposition rates of thin films and characteristics of deposited thin films depend on circumstances of the process chamber, such as chamber temperature and pressure, accompanying precursor's flow rate. Another problem in CVD coating, wherein reactants and the products of reaction coexist in a close proximity to the deposition surface, is the probability of inclusion of reaction products and other contaminants in each deposited layer. Also reactant utilization efficiency is low in CVD, and is adversely affected by decreasing chamber pressure. Still further, highly reactive precursor molecules contribute to homogeneous gas phase reactions that can produce unwanted particles which are detrimental to film quality. Therefore, Low Pressure Chemical Vapor Deposition (LPCVD) by which step coverage and uniform thickness of thin film are improved is now in the spotlight in forming thin films on a substrate surface. However, when using LPCVD, the deposition rates decrease, thereby attempting to introduce reaction gases having higher partial pressures. This also causes the problems that gas reactions occur in an undesired position of reaction chamber, so the possibility of contaminants in the deposited layer increases.

On account of above-mentioned problems, Atomic Layer Deposition (ALD) has been researched and developed. Although a slower process than CVD and although the similarity to CVD in using precursor reactions, ALD demonstrates a remarkable ability to maintain ultra-uniform thin deposition layers over complex topology. This is at least partially because ALD is not flux dependent as described earlier with regards to CVD. This flux-independent nature of ALD allows processing at lower temperatures than with conventional CVD rocesses.

ALD processes proceed by chemisorption at the deposition surface of the substrate. The technology of ALD is based on concepts of Atomic Layer Epitaxy (ALE) developed in the late 1970s or early 1980s, for example, U.S. Pat. No. 4,058,430, for growing of polycrystalline and amorphous films of ZnS and dielectric oxides for electroluminescent display devices. The technique of ALD is based on the principle of the formation of a saturated monolayer of reactive precursor molecules by chemisorption. In ALD appropriate reactive precursors are alternately pulsed into a deposition chamber. Each injection of a reactive precursor is separated by an inert gas purge. Each precursor injection provides a new atomic layer additive to previous deposited layers to form a uniform layer of solid film. The cycle is repeated to form the desired film thickness.

A good reference work in the field of Atomic Layer Epitaxy, which provides a discussion of the underlying concepts incorporated in ALD, is Chapter 14, written by Tuomo Suntola, of the Handbook of Crystal Growth, Vol. 3, edited by D. T. J. Hurle, .COPYRGT. 1994 by Elsevier Science B. V. The Chapter title is "Atomic Layer Epitaxy". This reference is incorporated herein by reference as background information.

To further illustrate the general concepts of ALD, an ALD process for forming a film of materials A and B, as elemental materials, will be explained hereinafter. A solid layer of element A is formed over the initial substrate surface, and then a first purge is processed to form a single atomic layer of element A. Over the A layer, a layer of element B is applied, and then, a second purge is performed. Therefore, the layers are provided on the substrate surface by alternatively pulsing a first precursor gas A and a second precursor gas B into the region of the surface, resulting in providing the AB solid material.

Meanwhile, gaseous reactants and their bonding energy are dependant on a substrate and a material which are under the deposited thin films. When forming a single-crystalline layer on a surface of single-crystalline silicon substrate, there are a lot of active portions which are distributed uniformly on that silicon substrate surface and on which gaseous reactants are deposited. By way of applying a thermal energy to the gaseous reactants with maintaining the substrate at a high temperature, gaseous reactants are uniformly deposited and decomposed in the surface of substrate, and thus, silicon atoms are rearranged and grow to a single-crystalline thin film in accordance with the single-crystalline surface of the substrate. At this time, the physically deposited gaseous reactants exist on the chemically deposited silicon layer provided on the substrate surface, and thus such gaseous reactants act as impurities and contaminants that decrease purity of deposited layer. Therefore, a purge process proceeds after such a depositing process. Namely, the substrate heated with the aid of a suitable heating source is subjected to the gaseous reactants, and then purged using an inert gas. Therefore, the chemically deposited reactants are left on the substrate, whereas the physically deposited reactants are removed from the substrate, resulting in forming a single atomic silicon layer on the single-crystalline silicon substrate.

This type of procedure is also disclosed in U.S. Pat. No. 4,389,973, for example. According to that patent, the wafer is sequentially subjected to a plurality of gaseous reactants in order to form thin films thereon. During the deposition processes, the gas phase diffusion barrier is used as a carrier gas in order to prevent reactions between source gases, or the carrier gas is used to remove the residual gases after injecting each source gas.

U.S. Pat. No. 4,767,494, as another example, discloses the compound semiconductor thin film formed by growing a plurality of molecular layers one over another. According to that invention, while a carrier gas and a small quantity of hydride containing an element in Group V or VI are normally flowed, an organometallic compound which is diluted with hydrogen and which contains an element in Group V or VI and a hydride which is diluted with hydrogen and which contains an element in Group V or VI are alternately introduced over a substrate so that an atomic layer of an element in Group III or II and an atomic layer of an element in Group V or VI are alternately grown over the substrate. Therefore, grown layers having a high degree of purity can be obtained.

In U.S. Pat. No. 5,130,269, the method of growing a gallium arsenide single crystal layer on a silicon substrate comprises steps of growing a buffer layer of aluminum arsenide on the silicon substrate by Atomic Layer Epitaxy (ALE), and growing the gallium arsenide single crystal layer on the buffer layer epitaxially.

As known from the above-mentioned patented invention, ALD has been developed to overcome the drawback of CVD, so that ALD in resent obtains better uniformity over increasingly large area substrates and excellent step coverage. Contrary to CVD where gaseous reactants simultaneously flow into a reaction chamber to deposit thin films on a substrate, ALD alternately subjects the substrate to gaseous reactants, and includes an inert gas purge process to remove residual gases, thereby dropping the impurity content in the deposited layers. For example, when forming a thin film on a substrate using two vapor phase reactants, one cycle of the gas sequence for the growth of the thin film includes four sub-steps. In a first sub-step, a first vapor phase reactant is introduced into a reaction chamber in which a substrate is positioned. Thereafter, residual gas is removed from the reaction chamber, i.e., a second sub-step. In a third sub-step, a second vapor phase reactant is introduced into the reaction chamber to form a thin film with the first layer formed of the vapor phase reactant. In a four sub-step, residual gas is removed again from the reaction chamber. This conventional ALD technology is disclosed in U.S. Pat. Nos. 4,413,022 and 6,015,590. As a method for removing the residual gas, the inert gases are used in U.S. Pat. No. 4,413,022, and the vacuum pump is adopted according to U.S. Pat. No. 6,015,590.

Figure 1:
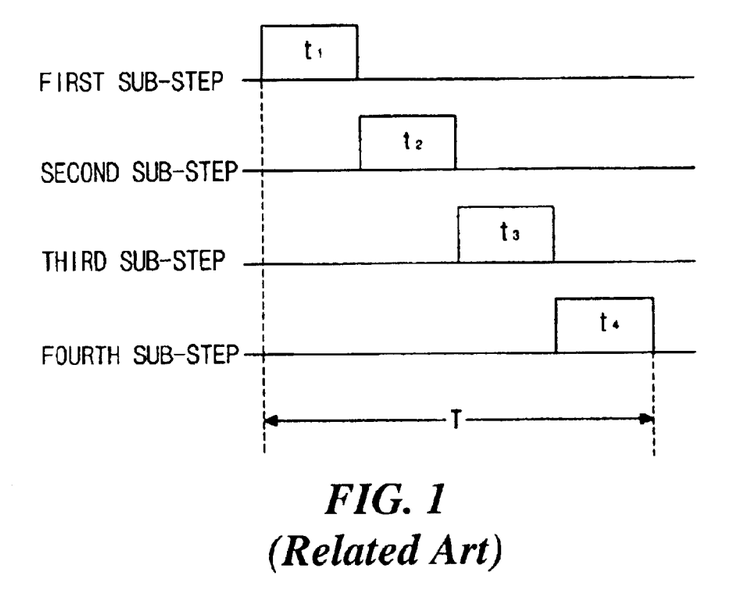
FIG. 1 is a graph illustrating one cycle of forming a thin film using a conventional ALD technology.

FIG. 1 is a graph illustrating one cycle of forming a thin film using a conventional ALD technology. In FIG. 1, one cycle T of forming a thin film includes a first quantity $t_1$ representing the time during the first sub-step, a second quantity $t_2$ representing the time during the second sub-step, a third quantity $t_3$ representing the time during the third sub-step, and a fourth quantity $t_4$ representing the time during the fourth sub-step. The time quantities $t_2$ and $t_4$ over which the residual gases are removed are longer than the time quantities $t_1$ and $t_3$ over which the substrate is objected to the gaseous reactants. As a result, the process of forming a thin film needs a sufficiently long time, and manufacturing yield of thin film is reduced.

At this point, a lot of methods and plans are introduced to reduce the time required in each sub-step. However, the time quantities $t_1$ and $t_3$ should maintains for a sufficient time because these should be enough to distribute and absorb the injected gaseous reactants over the whole surface of the substrate. Furthermore, it is difficult to reduce the time quantities $t_2$ and $t_4$.

For example of applying the above-mentioned ALD method, a process of forming an alumina ($Al_2O_3$) film using the conventional ALD is presented in Applied Physics Letters—Volume 71, No. 25, pp. 3604–3606, Dec. 22, 1997. At a deposition temperature of about 370 degrees centigrade (° C.), tri-methyl-aluminum [$Al(CH_3)_3$, TMA] is introduced into the reaction chamber during the first sub-step $t_1$ of about one second under the pressure of about 230 mTorr. Then, the introduction of TMA is stopped, and Ar gas is introduced into the reaction chamber during the second sub-step $t_2$ of about 14 seconds. The above-mentioned Ar gas prevents the TMA from being over-adsorbed on the silicon substrate, and discharges a residual non-reacting gas out of the reaction chamber. Thereafter, a de-ionized water (DIW) vapor is introduced into the reaction chamber during the third sub-step $t_3$ of about 1 second under the pressure of about 200 mTorr. Subsequently, the introduction of TMA is stopped, and Ar gas is introduced again into the reaction chamber during the fourth sub-step $t_4$ of about 14 seconds such that another residual non-reacting gas is discharged out of the reaction chamber.

After one cycle, specifically 30 seconds, during the above-mentioned process, the obtained film is less than 0.3 nm in thickness. Therefore, for the fabrication of 10 nm film, the above-mentioned cycle should be repeated for about 33 times. In other words, it takes more than 990 seconds to fabricate the 10 nm film by applying the ALD. Accordingly, although the use of the conventional ALD method can produce a thin film having a low-impurity content, it takes longer processing time while depositing the film on the substrate.

Meanwhile, if a substrate or a underlayer is polycrystalline or amorphous, the energy level of active portion varies depending on substrate's or underlayer's crystal structure and surface state because the active portions on which the gaseous reactants are deposited exist in a various state. Therefore, when the gaseous reactants are objected to the substrate or underlayer, the active portion's position and the binding energy are determined by the gaseous reactant type. At this point, as mentioned before, the physically deposited reactants are cleaned from the reaction chamber in accordance with the quantity of injected inert gas and the chamber pressure or the vacuum pump capacity. However, at the time of that cleaning process, the chemically deposited reactants can be exhausted from the substrate or underlayer if the binding energy is weak in the active portion. Therefore, the layer thickness, which is obtained during one cycle, is various depending on the process condition although the gaseous reactant is the same. To obtain a determined thickness, thus, the deposition process alluded before should be repeated a lot more times. This results in increasing depositing time and decreasing manufacturing yield.

As mentioned before, in the CVD method, a lot of gaseous reactants are injected into the reaction chamber and converted into radicals, thereby forming thin films by interactions of radicals. At this time of forming the thin films, by-products are produced and then trapped into the deposited layers due to the continuous apply of gaseous reactants.

However, in case of the ALD method, after introducing the gaseous reactants to the substrate, the purge process is repeatedly performed over each reactant introduction. Therefore, the impurity concentration in the deposited layer and the layer thickness over one cycle are determined in accordance with the quantity of inert gas and the time consumption. Furthermore, the hourly productivity is varied by these inert gas quantity and the time passage. In other words, when the inert gas quantity increases and when it takes longer processing time to purge the active portion and to pump down the reaction chamber for the purpose of decreasing the impurity ratio from the layer, the adhered reactants are rapidly reduced due to the removal of deposited elements. These cause the decrease of layer thickness less than single atomic layer and produce the inferior production, thereby deteriorating the hourly productivity. Moreover, due to the injecting and purge processes, there are other problems of shifting gas injection devices, and thus, the time delay is unfortunately caused, and productivity is further declined. To overcome these problems, the complex facilities having various equipments and devices are recommended, but those facilities increases the production cost in the field of semiconductor devices.

SUMMARY OF THE INVENTION

Accordingly, the present invention is directed to a method of forming a thin film that substantially obviates one or more of the problems due to limitations and disadvantages of the related art.

An object of the present invention is to provide a method of forming a thin film, which presents an excellent step coverage, a uniform layer composition and a high degree of purity in the thin film.

Another object of the present invention is to provide a method of forming a thin film, which has a short processing time of layer deposition.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve the above object, the preferred embodiment of the present invention provides a method of forming a thin film in a first chamber where a heater and a suscepter are located. The method includes the steps of disposing an object on the susceptor so as to form the thin film thereon; heating the object; a first sub-step of introducing a first gaseous reactant into the first chamber such that the first gaseous reactant is absorbed on the object to form an absorption layer; a second sub-step of introducing a second gaseous reactant into the first chamber such that the second gaseous reactant reacts with the absorption layer absorbed on the object; and a third sub-step of introducing a reducing gas into the first camber such that the reducing gas reduces by-products and impurities of the first and second gaseous reactants.

In one aspect, the first, second and third sub-steps are sequentially repeated as one cycle so as to form the thin film having an ultra-high degree of purity. A thickness of the thin film having the ultra-high degree of purity is 0.3 nm after performing the first and second sub-steps one time. The thin film having the ultra-high degree of purity is 10 nm in thickness after final deposition process.

In another aspect, three-time repetitions of the first and second sub-steps and one time of the third sub-step form one cycle of deposition and several repetitions of one cycle form the thin film having a high degree of purity. A thickness of the thin film having the high degree of purity is 1 nm after three-time repetitions of the first and second sub-steps. A thickness of the thin film having the high degree of purity ranges from 0.2 to 0.3 nm after one time of the first and second sub-step. The thin film having the high degree of purity is 10 nm in thickness after final deposition process.

In another aspect, more than ten-time repetitions of the first and second sub-steps and one-time of the third sub-step form one cycle of deposition and several repetitions of one cycle form one of crystalline and amorphous thin films. A thickness of each of crystalline and amorphous thin films ranges from 2 to 3 nm after one cycle of deposition. Each of crystalline and amorphous thin films is 10 nm in thickness after final deposition process. A thickness of each of crystalline and amorphous thin films ranges from 0.2 to 0.3 nm after performing the first and second sub-steps one time.

In the above-mentioned method, the first and second sub-steps form an oxidized layer and the reducing gas is one of oxygen and ozone. The first and second sub-steps form a nitride layer and the reducing gas is one of ammonia and hydrazine.

The above-mentioned method further includes the step of thermal-treating the object in a second chamber after the third sub-step when the deposited thin film is used as a dielectric layer for the electric device. The second chamber is a vacuum chamber and the reducing gas of the third sub-step is introduced in the second chamber. The reducing gas introduced in the second chamber is excited into a plasma during the thermal treatment for the dielectric layer. The dielectric layer is one of alumina thin film and tantalum pentoxide ($Ta_2O_5$) thin film. The method further includes the step of forming a polycrystalline silicon layer on each of alumina thin film and tantalum pentoxide ($Ta_2O_5$) thin film. Forming one of alumina thin film and tantalum pentoxide ($Ta_2O_5$) thin film and forming the polycrystalline silicon layer are sequentially performed in the first and second chamber.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 2:
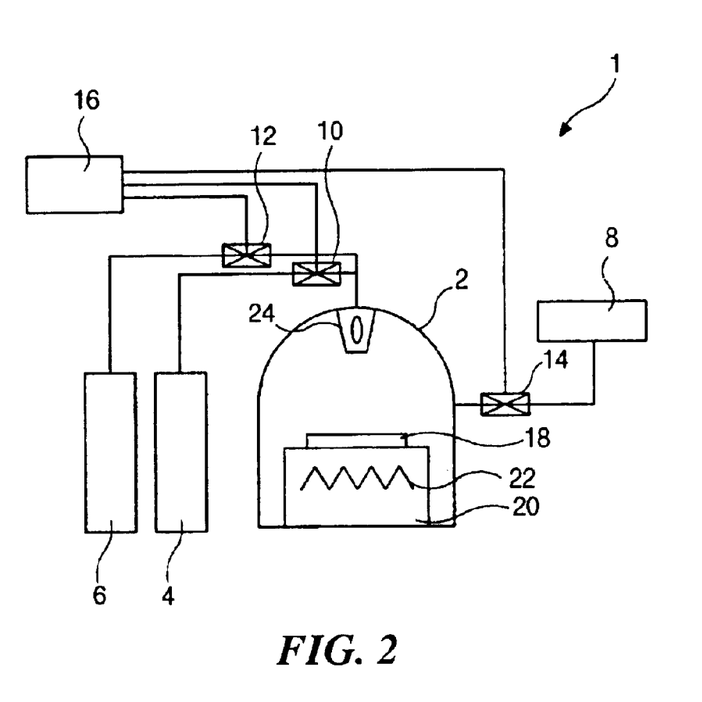
FIG. 2 is a schematic diagram illustrating a thin film deposition apparatus used in a method of fabricating a thin film according to the present invention.

FIG. 2 is a schematic diagram illustrating a thin film deposition apparatus used in a method of fabricating a thin film according to the present invention. An Atomic Layer Deposition (ALD) apparatus 1 includes a reaction chamber 2 in which a thin film deposition process is carried out; a first storage device 4 where a source gas is stored; a second storage device 6 where an inert gas is stored; a third storage device 8 where a reducing gas is stored; quantity flowing from the first 4, second 6 and third 8 storage devices, respectively. In the reaction chamber 2, a susceptor 20 having a heating device 22 therein is positioned. An object 18, such as a wafer or a substrate, is mounted on the susceptor 20. An injector 24, which injects the gases supplied from the first and second storage devices 4 and 6 through the first and second valves 10 and 12, is located on the top of the reaction chamber 2.

Figure 3:
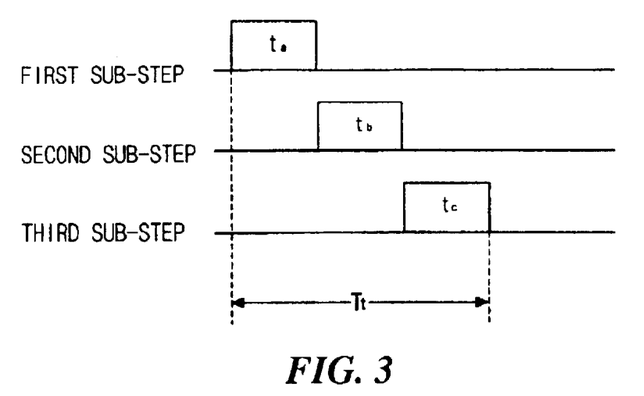
FIG. 3 is a graph illustrating one cycle of forming the thin film according to the present invention.

The cycle of forming the thin film in the above-mentioned ALD apparatus is illustrated with reference to FIG. 3, as an example, when using two gaseous reactants. FIG. 3 is a graph illustrating one cycle of forming the thin film according to the present invention. In a first sub-step, a first gaseous reactant is introduced into the reaction chamber for the purpose of forming a first gas layer over the object surface, and the first sub-step takes a first time $t_a$. In a second sub-step, a second gaseous reactant is introduced into the reaction chamber and then it reacts with the first gas layer for the purpose of a thin film on the substrate. The second sub-step takes a second time $t_b$. In a third sub-step, the thin film on the substrate is reduced using the reducing gas to obtain a high degree of purity, and the third sub-step takes a third time $t_c$. Therefore, it takes a total time $T_t$ to carry out one cycle.

The above-mentioned process can chemically be explained as follows. Two gaseous reactants A and B can produce a product C and a by-product D, and this reaction can be represented by $A+B \rightarrow C+D$. In other words, after the first gaseous reactant A is first introduced to the active portion of the substrate to form a first layer, the second gaseous B is injected into the chamber and then reacts with the first layer. Thus, the product C and the by-product D are produced. At this time, the by-product D is discharged from the substrate and then diffused in the reaction chamber.

In the ALD method according to the present invention, the second sub-step of conventional ALD is omitted. Although the conventional ALD method has four sub-steps within one cycle, the inventive ALD method has three sub-steps including the reduction process. Further according to the present invention, it is distinguishable that the first, second and third sub-steps are performed selectively, alternately and repeatedly. Namely, the sequential order of sub-steps and the number of repetition times are determined by the thin film type. As mentioned hereinbefore, the conventional ALD method repeats one cycle having the four sub-steps when forming the thin film by a certain thickness. However, the inventive ALD method makes it possible to execute the first, second or third sub-steps selectively and repeatedly depending on the thin film type. After practicing the first and second sub-steps just one time, the thickness of the thin film is less than 0.3 nm that is the same thickness of the thin film fabricated by one cycle of the conventional ALD method. To maintain the thickness less than 0.3 nm, it is a major factor in the first and second sub-steps to control the modulation parameters, such as atmospheric temperature, reaction pressure, time of injecting the gaseous reactants through injector, quantity of gaseous reactants, and quantity of inert gas. These modulation parameters, in the present invention, can be obtained and optimized by several times of experiments.

Figure 4:
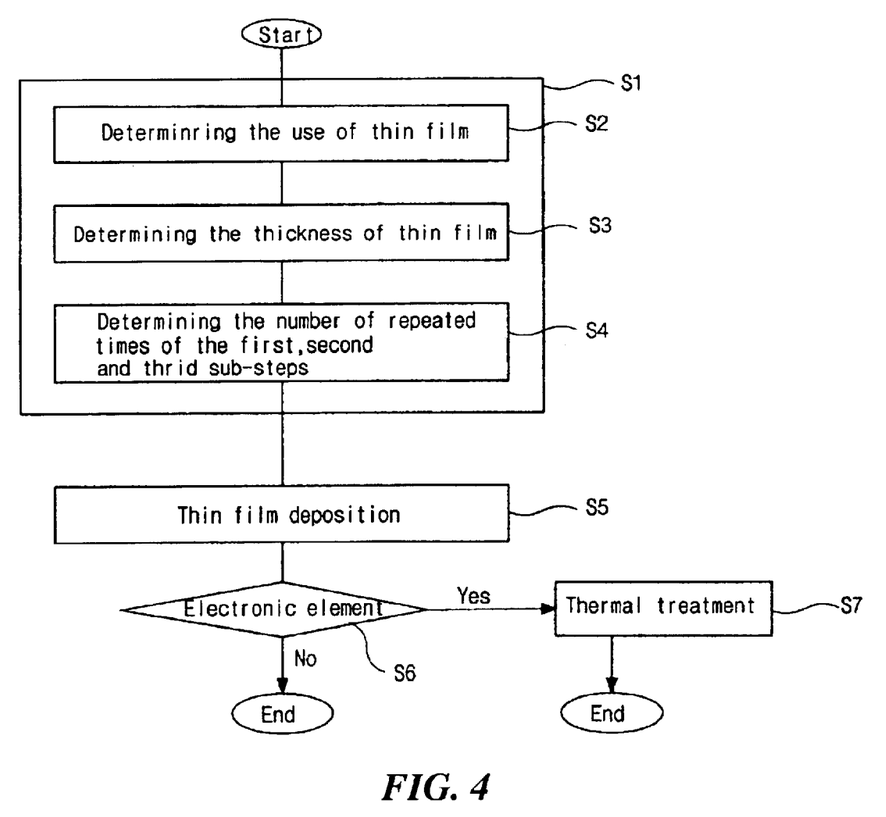
FIG. 4 is a process diagram illustrating a method of forming the thin film according to the present invention.

FIG. 4 is a process diagram illustrating a method of forming the thin film according to the present invention. Before carrying out a step "S5" of depositing a thin film, a preliminary process "S1" should be preceded. The preliminary process step "S1" of the present invention includes a second step "S2" determining the use of thin film, a third step "S3" determining the thickness of thin film, and a fourth step "S4" determining the number of repeated times of the first, second and third sub-steps. In the present invention, the fifth step "S5" depositing the thin film includes the first and second sub-steps where the thin film is actually formed and the third sub-step where the purity of thin film increase. Therefore, in the preliminary process "S1", it should preliminarily be determined that how many times the first and second sub-steps are repeated and when the third sub-step is performed among the repetitions of the first and second sub-steps. The preliminary process "S1" of FIG. 4 can be classified into several examples as follows.

EXAMPLE 1

A first example is the case that the thin film requires an ultra-high degree of purity. In the first example, it is essentially considered that the purity of thin film, so each of the first, second and third sub-steps is performed sequentially just one time to form the thin film in a thickness of less than 0.3 nm. By the repetition of these sequential processes, the thin film having the ultra-high purity can be obtained. Especially, when using the first example, it is beneficial that the final thin film is equal or less than 10 nm in thickness.

Namely, for the purpose of forming the thin film having the thickness of equal or less than 10 nm, a unit process, where the first, second and third sub-steps are sequentially performed and which results in 0.3 nm in thin film thickness, is repeated several times.

EXAMPLE 2

In a second example, the thin film requires a high degree of purity. In this case of second example, the purity and the productivity are both considerable, so that the optimized process is determined. According to this second example, it is possible that the thin film has the high purity and is fabricated with consideration of the utmost productivity.

The first and second sub-steps are first repeated several times, substantially 3 or 4 times, until the thin film has a thickness of 1 nm. Thereafter, the third sub-step is performed to make the thin film have the high purity. Because it is recommended that the thin film is less than 10 nm in thickness, the modulation parameters during the first and second sub-steps are controlled to constitute the thin film to be 0.2 to 0.3 nm.

Accordingly, for the purpose of the high purity, the first and second sub-steps are repeated 3 or 4 times, and then the third sub-step is performed, thereby forming the thin film having 1 nm. By the repetition of this process making 1 nm thin film, the thin film can finally have a thickness of 10 nm with high purity. At this time, the number of repeating time of the first and second sub-steps can be adjustable depending on the thin film type. However, it is recommended that this repeating time is beneficially less then 10.

EXAMPLE 3

In a third example, a crystalline thin film and an amorphous thin film can be formed. In this case, low temperature deposition, step coverage and thickness uniformity are important factors, so the first and second sub-steps are sequentially performed several times, especially ten times, till the thin film has a thickness of 2 to 3 nm. Thereafter, this thin film is reduced during the third sub-step.

By repeating the above-mentioned deposition process, the crystalline thin film and the amorphous thin film can be obtained. Especially, the thickness of crystalline and amorphous thin film is to be more than 10 nm, so the thickness of the thin film ranges from 0.2 to 0.3 nm after the first and second sub-steps are performed just one time.

Table 1 shows a relationship of the thin films that are formed by above examples during the preliminary process "S1" of FIG. 4. The letter "L" denotes the number of deposition cycles of the sequential first and second sub-steps. The letter "M" denotes a thickness of the thin film after the third sub-step. The letter "N" represents a final thickness of the thin film obtained by the first, second and third examples alluded above. The letter "O" represents a thickness of thin film after the first and second sub-steps are performed just one time.

TABLE 1

| | Thin film having an ultra-high degree of purity (EXAMPLE 1) | Thin film having a high degree of purity (EXAMPLE 2) | Crystalline or amorphous thin film (EXAMPLE 3) |
|---|---|---|---|
| L | One time | Three or four times (Max: 10 times) | More than ten times |
| M | Less than 0.3 nm | About 1 nm | About 2 to 3 nm |
| N | Less than 10 nm | Less than 10 nm | More than 10 nm |
| O | Less than 0.3 nm | More than 0.2 and less than 0.3 | About 0.2 to 0.3 nm |

In the above-mentioned process, the third sub-step is the reduction process, so reducing gases are used depending on characteristics of thin film to remove the impurity contained in the thin film. Thus, the thin film type and structure determine what kinds of reducing gases are used in each example 1, 2 or 3.

If the deposited thin film is a crystalline thin film, the small grains are distributes uniformly in the primary step of deposition, and thus the impurities are also distributed uniformly along with the grain boundaries. In this primary step, when the generic reducing gases are injected into the chamber, the impurities can easily be removed because of the large size of grain boundaries through which the reducing gases diffuse and to which the reducing gases contact in order to remove the by-products and impurities by the reaction thereof. However, as the thin film becomes larger in thickness, the thin film has a polycrystalline structure by way of enlarging the grain boundaries non-uniformly. Therefore, in order to remove the impurities under the thin film, it is required to increase the moving distance of the reducing gases. Furthermore, the reducing gases having high temperature and the plasma gases are needed for a sufficiently long time.

On the other hand, if the thin film is an amorphous thin film, there are a lot of pinholes in the amorphous thin film. Therefore, it is easy to remove the by-products and impurities through these pinholes using the reducing gases, because the thin film is relatively thinner in the primary step of deposition. However, as the thin film becomes larger in thickness, the pinholes are distributes non-uniformly over the thin film, thereby resulting in the decrease of efficiency in removing the impurities. Therefore, in order to remove the impurities under the thin film, the reducing gases having high temperature and the plasma gases are also needed.

Accordingly in the present invention, it is recommended that the thickness applied to the reduction process and the type of reducing gases are precisely determined depending on the properties of deposited thin film. From this recommendation, the present invention can control the impurity concentration under the permissible limit depending on the thin film type.

When determining the thickness of thin film and determining the number of repeated time in the preliminary process step "S1" of FIG. 4, the third sub-step can be classified into following examples in accordance with the reducing gases.

EXAMPLE 4

In a fourth example, the reducing gas is the same as one of the first and second gaseous reactants. In this case, one cycle of forming a thin film is classified into three sub-steps. In a first sub-step, a first gaseous reactant, which is the same as a reducing gas, is injected into the reaction chamber where the substrate is located. Then, a second gaseous reactant that is different from the first gaseous reactant is introduced into the reaction chamber, in a second sub-step. Thereafter, the reducing gas that is the same as the first gaseous reactant is injected into the reaction chamber.

Namely, the first gaseous reactant introduced in the first sub-step not only acts as reactive gas but also is absorbed on the absorption sites of the substrate surface, and then provides the second gaseous reactant with the active portions. Furthermore, the reducing gas injected in the third sub-step acts as an additional reducing gas.

For more detailed explanation and exemplary, when TiN thin film is formed using $TiCl_4$ and $NH_3$, the $NH_3$ gas is used as a reducing gas. In the first sub-step, the $NH_3$ gas is first introduced into the reaction chamber and then absorbed on the absorption sites of the substrate. Thereafter, the first gaseous reactant ($NH_3$) is turned into an excited state, thereby providing the increase of active portions to the $TiCl_4$ that is introduced in the second sub-step. $TiCl_4$ introduced in the second sub-step and $NH_3$ introduced in the third sub-step are reacted with each other as follows:

$$2TiCl_4 + 2NH_3 + H_2 \rightarrow 2TiN + 8HCl$$

In the above-mentioned reaction, the $NH_3$ gas introduced in the third sub-step acts as a reducing agent by way of providing nitrogen that is a component of TiN film and hydrogen that helps to remove chlorine of TiCl. Furthermore, the hydrogen molecules are added in the above reaction to minimize residual chlorine, due to the shortage of hydrogen resolved form $NH_3$.

In this example 4, it is possible that the first sub-step is omitted. Namely, if the second and third sub-steps are performed without the first sub-step and then if the time passes for a certain amount of time, the same result can be obtained. Namely, the same TiN thin film can be obtained. However, $TiCl_4$ can inadequately be absorbed on the substrate surface and not be converted into the excited state, thereby causing the non-uniform thickness and the increase of impurity in the primary step of the process. Therefore, it is recommended to inject the $NH_3$ gas in the first place.

EXAMPLE 5

In a fifth example, the reducing gas is different from the first and second gaseous reactant. Especially in this case, oxygen or ozone are used as reducing gas to form an oxidized thin film. One cycle of forming a thin film is also classified into three sub-steps: a first sub-step introducing a first gaseous reactant into the reaction chamber, a second sub-step introducing a second gaseous reactant, and a third sub-step introducing a reducing gas.

For more detailed explanation and exemplary, when an $Al_2O_3$ thin film is formed using $(CH_3)_3Al$ and $H_2O$, the organic gas $((CH_3)_3Al)$ is utilized as a first gaseous reactant, de-ionized water (DIW: $H_2O$) is utilized as a second gaseous reactant, and the oxygen or ozone is utilized as a reducing gas. $(CH_3)_3Al$ introduced in the first sub-step and $H_2O$ introduced in the second sub-step are reacted with each other to form $Al_2O_3$ thin film as follows:

$$2(CH_3)_3Al+3H_2O \rightarrow Al_2O_3+6CH_4$$

In the above reaction equation, oxygen and ozone acting as a reducing gas combine with carbon that may remain in $Al_2O_3$ thin film, thereby producing carbon monoxide (CO) or carbon dioxide ($CO_2$).

According to the fourth and fifth example alluded above, the reducing gas used in the third sub-step penetrates and diffuses along the grain boundaries and through the pinholes in the thin films, and then reacts with impurities (e.g., chlorine or carbon). Therefore, the gas reacting with the impurities flows out of the thin film to remove the impurities. Furthermore, when the nitride or oxygen component is insufficient in the deposited oxidized or nitride layer, the reducing gas reacts with the thin film to form a stoichiometric component in the high temperature vacuum thermal treatment performed after the third sub-step. Therefore, when using the reducing gas, the properties and characteristics of the thin film can be improved.

Now referring to FIG. 4 of the present invention, if the deposited thin film is electrical element, such as a dielectric layer used in the capacitor, the thin film requires thermal treatment at a high temperature without exposing to the atmosphere, i.e., step "S7" of FIG. 4. This thermal treatment is advisably implemented in the other chamber of complex facility without exposing to the open air.

Figure 5:
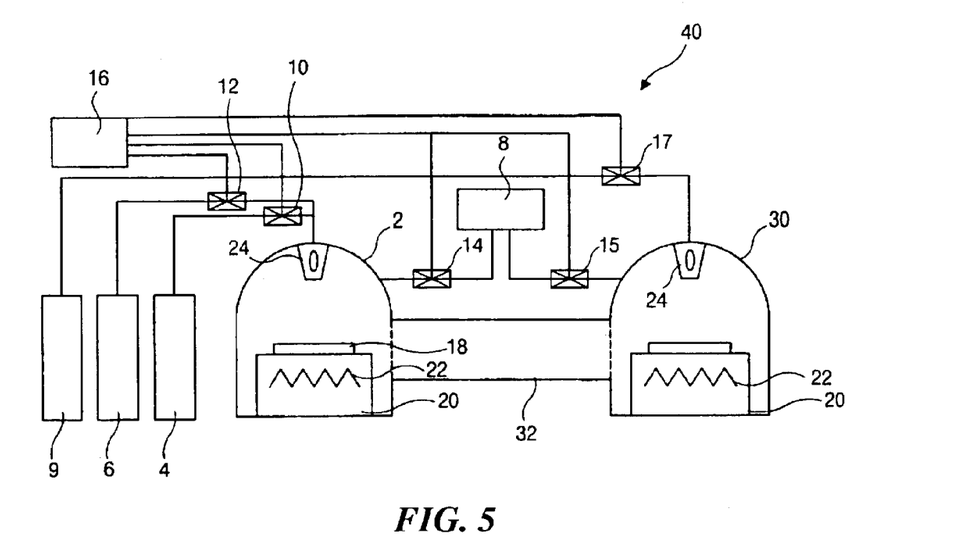
FIG. 5 is a schematic diagram illustrating a thin film deposition apparatus assembly according to the present invention.

FIG. 5 is a schematic diagram illustrating a thin film deposition apparatus assembly according to the present invention. This complex facility for the thin film deposition includes the deposition apparatus shown in FIG. 2. The thin film deposition assembly 40 includes a first chamber 2 that is connected with a first storage device 4, a second storage device 6 and a third storage device 8, and a second chamber 30 that is connected with the third storage device 8 and a fourth storage device 9. The fourth storage device 9 stores gas for thermal treatment and the second chamber 30 thermal-treats the substrate having the deposited thin film using the gas from the fourth storage device 9. Since the second chamber 30 is connected to the third storage device 8, it also use the gas stored in the third storage device 8. A passage 32, through which the substrate or wafer 18 can be carried without being exposed to the atmosphere, is located between the first and second chambers 2 and 30. As described in FIG. 2, a controller 16 controls first 10, second 12 and third 14 valves each handling gas quantity flowing from the first 4, second 6 and third 8 storage devices, respectively. Additionally, the controller 16 controls fourth valve 15 and fifth valve 17 each handling the gas quantity flowing from the third storage device 8 and fourth storage device 9, respectively. In the first and second chambers 2 and 30, susceptors 20 each having a heating device 22 therein are positioned, respectively. Further, injectors 24, which injects the gases supplied from the storage devices, is located on the top of each of chambers 2 and 30.

In the thin film deposition assembly 40 of FIG. 5, the time for thermal treatment can be adjustable in order to optimize the properties and characteristics of thin film by way of secondly removing the impurities. As mentioned before, the reducing gas having high temperature or the plasma gas is selected depending on the thin film type, or both the reducing gas and the plasma gas can be used together.

Especially, when the reducing gas and the plasma gas are both used in the above thermal treatment, the thin film can have a stoichiometric structure with the reduction of the impurities therein. When it is insufficient to remove the impurities due to the larger thickness of the thin film, the excited plasma gas, as a reducing agent, can be used to increase penetration depth into the thin film. However, the efficiency of removing impurities may decrease due to the plasma property, such as a plasma free pass, when the substrate surface has unevenness or large step of pattern.

Meanwhile, in case of the crystalline thin film, the impurities move to the grain boundaries during the above-mentioned thermal treatment. In case of the amorphous thin film, the impurities exist in a surface of the pinhole that has a discontinuous distributions because of the repeated deposition. Therefore, the amorphous thin film requires the large number of reducing processes using the reducing gas in the third sub-step rather than the crystalline thin film. As a result, it is recommended that the impurities of the amorphous thin film be advisably removed in the thermal treatment.

Since the thermal treatment is performed just after the third sub-step, the composition elements of the thin film are re-arranged to be crystallized or to have a high density. Furthermore, since the impurities having remained in the thin film diffuse out of the thin film through the grain boundaries and pinholes, the thin film can have an better improved properties and characteristics. Especially, such a thermal treatment is executed in the vacuum chamber, and thus, it is possible that the substrate is thermal-treated at a relatively low temperature rather than a conventional thermal treatment that is executed under the atmosphere through horizontal or vertical tubes for about 30 minutes.

Contrary to the conventional art where the composition elements and impurities are exposed to the atmosphere to have a stable bond and where the thermal treatment is then executed, the present invention executes thermal treatment in an unstable early stage of deposition. Thus the impurities can be removed by way of reaction with the reducing agent affected by thermal energy. Further, the component of the thin film can easily be re-arranged through the atomic movement.

The thin films, e.g., SiN, $SiO_2$, $Al_2O_3$ and $Ta_2O_5$ thin films, which are formed at a low temperature using the hydrogenated gaseous reactant, include a lot of hydrogen bonds therein. If these thin films are thermal-treated at a high temperature in a vacuum chamber, the hydrogen bonds of Si—H and N—H decrease in proportion to the thermal treating temperature and time. When the thin films formed by such a thermal treatment are used in the electrical devices, such as the transistors or capacitors, the stable operating characteristics are obtained.

Figure 6A:
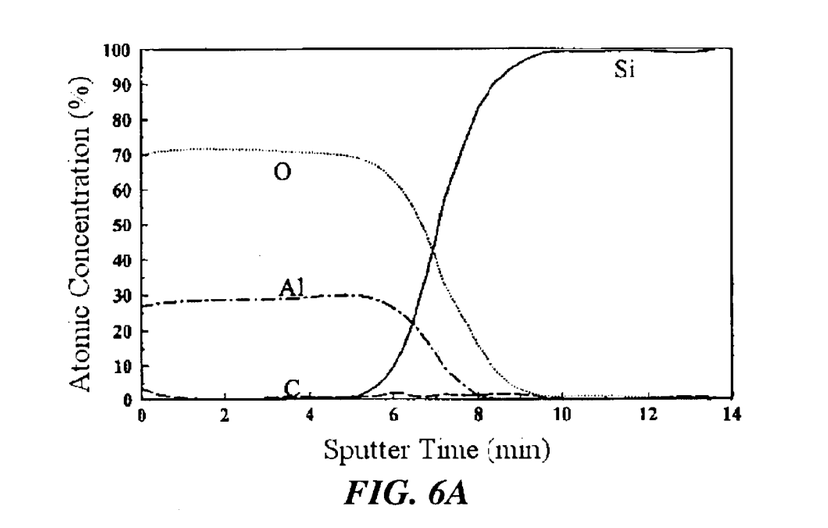
FIGS. 6A and 6B are graphs showing atomic compositions of $Al_2O_3$ thin films each fabricated through different processing conditions according to the present invention.
Figure 6B:
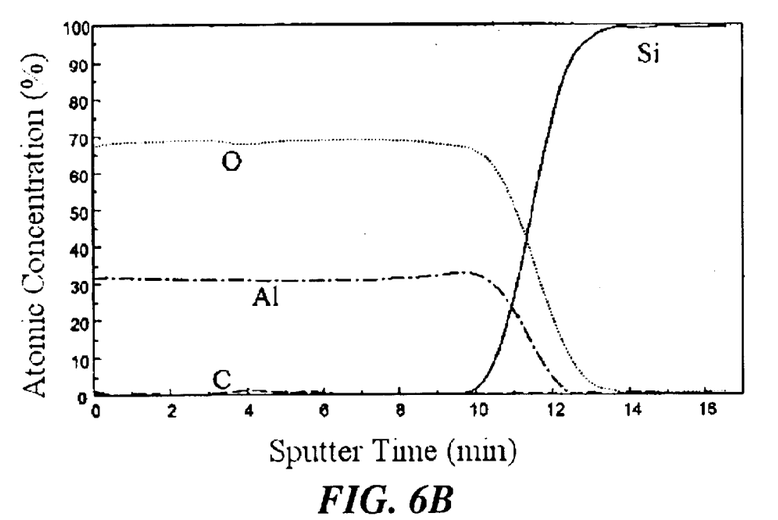
Figure 6C:
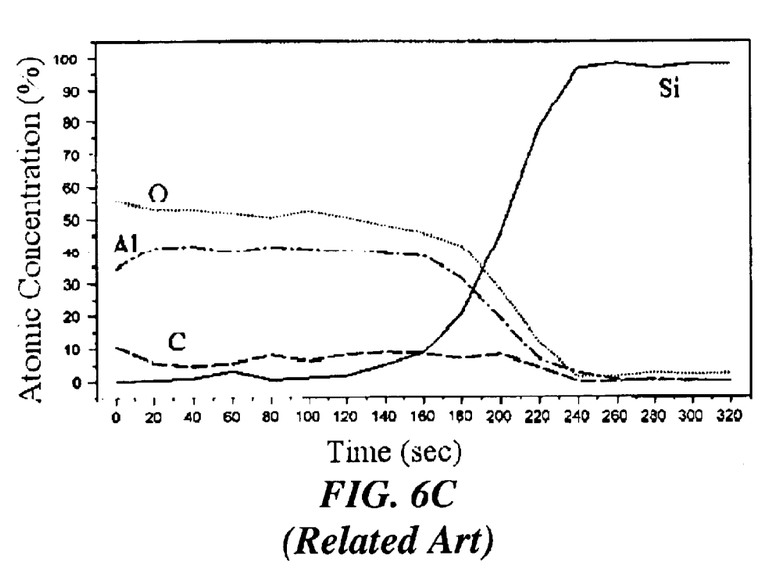
FIG. 6C is a graph showing atomic composition of $Al_2O_3$ thin film fabricated through conventional CVD in comparison with the present invention.

FIGS. 6A and 6B are graphs showing atomic compositions of $Al_2O_3$ thin films each fabricated through different processing conditions according to the present invention, and FIG. 6C is a graph showing atomic composition of $Al_2O_3$ thin film fabricated through conventional CVD in comparison with the present invention.

For the results shown in FIGS. 6A and 6B, tri-methyl-aluminum [$Al(CH_3)_3$, TMA] is used as a first gaseous reactant and $H_2O$ vapor is used as a second gaseous reactant, according to the present invention for a thin film deposition method.

Referring to FIG. 6A, the total thickness of thin film was 8 nm and the substrate was exposed to the first gaseous reactant for about 0.5 seconds and to the second gaseous reactant for about 1 second. The thickness of thin film by being exposed to the first and second gaseous reactants one time was 0.2 nm at a temperature of 350 degrees centigrade (° C.) under a pressure of 20 mTorr. Oxygen (02) was used as a reducing gas and objected to the substrate for about 10 seconds. The first and second sub-steps were repeated 8 times and the number of repetitions of one cycle was 5.

For obtaining the result shown in FIG. 6B, the total thickness of thin film was 16 nm and the substrate was exposed to the first gaseous reactant for about 2 seconds and to the second gaseous reactant for about 1 second. The thickness of thin film by being exposed to the first and second gaseous reactants just one time was 0.4 nm at a temperature of 350 degrees centigrade (° C.) under a pressure of 20 mTorr. Oxygen ($O_2$) was used as a reducing gas and objected to the substrate for about 10 seconds. The first and second sub-steps were repeated 8 times and the number of repetitions of one cycle was 5.

Furthermore to show the graphs shown in FIGS. 6A and 6B, the Auger Electron Stereoscopy (AES) measurement was used for the atomic concentration of the thin film.

The result of FIG. 6C was measured under the following circumstance; TMA and ozone ($O_3$) were gaseous reactants and these reactants were objected to the substrate at a temperature of 350 degrees centigrade (° C.) under the pressure of 20 mTorr for about 450 seconds to get a thickness of 30 nm.

Referring to the graphs shown in FIGS. 6A, 6B and 6C, the thin film formed by the conventional CVD method contains 5 to 10 atomic percent of a carbon therethrough, but the thin films formed by the method of the present invention contains under 3 atomic percent of a carbon. Moreover, if the alumina thin film is crystallized at a temperature of 800 degrees centigrade (° C.) under the oxygen or ozone circumstance for about several minutes without being exposed to the atmosphere, the carbon concentration contained in the thin films may be further reduced.

Figure 7:
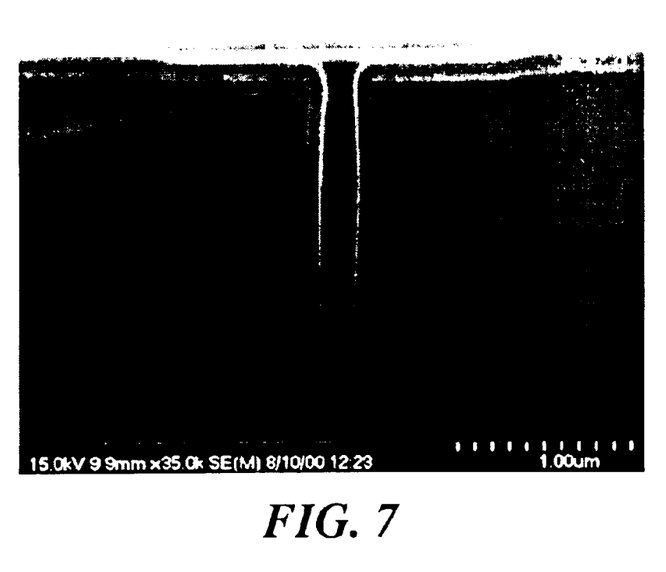
FIG. 7 is a scanning electron microscopy (SEM) photograph of a cross-section of an $Al_2O_3$ thin film according to the present invention.

FIG. 7 is a scanning electron microscopy (SEM) photograph of a cross-section of an $Al_2O_3$ thin film according to the present invention. For the purpose of the result shown in FIG. 7, the oxidized thin film having a thickness of 2.3 micrometers (• m) was etched to form a hole therein using a photolithography process. Thereafter, the $Al_2O_3$ thin film was formed by a thickness of 100 nm under the process condition described in FIG. 6A. A poly-silicon thin film having a thickness of 30 nm was further formed on the oxidized layer to clearly divide the oxidized layer and the $Al_2O_3$ thin film. At this point, the diameter of lower portion of the hole was 0.33 micrometers (• m), the diameter of upper portion of the hole was 0.45 micrometers (• m), and the depth of the hole was 2.3 micrometers (• m). As a result of this experiment, the step coverage according to the present invention represents more than 90%.

Hereinafter, the productivity of the thin film according to the present invention is explained in comparison with the conventional ALD method. Tables 2 and 3 show deposition times of the thin films having thickness of 10 nm, comparing the method of the present invention with the conventional ALD method.

According to the present invention, the thickness of the thin film formed during a unit time is 0.2 nm. The exposing time to both the first and second gaseous reactants is 1 second in both the conventional ALD method and the inventive method. Furthermore according to the present invention, the thickness of thin film by being exposed to the first and second gaseous reactants just one time is 0.2 nm.

TABLE 2

Conventional ALD Method

| | Removing residual gas | One cycle | The number of repetition of one cycle | Total |
|---|---|---|---|---|
| 10 nm Thin Film | Each 1 sec. | 4 sec. | 50 Times | 200 sec. |
| | Each 4 sec. | 10 sec. | | 500 sec. |
| | Each 14 sec. | 30 sec. | | 1500 sec. |

TABLE 3

Present Invention

| | Reduction time | One cycle | The number of repetition of one cycle | Total |
|---|---|---|---|---|
| A | 5 sec. | 7 sec. | 50 Times | 350 sec. |
| | 10 sec. | 12 sec. | | 600 sec. |
| | 30 sec. | 32 sec. | | 1600 sec. |
| B | 5 sec. | 15 sec. | 10 Times | 150 sec. |
| | 10 sec. | 20 sec. | | 200 sec. |
| | 30 sec. | 40 sec. | | 400 sec. |
| C | 5 sec. | 25 sec. | 5 Times | 125 sec. |
| | 10 sec. | 30 sec. | | 150 sec. |
| | 30 sec. | 50 sec. | | 250 sec. |

Referring to the present invention of Table 3, the letter "A" represents the thin film having an ultra-high degree of purity and a thickness of 0.2 nm. The letter "B" represents the case that the thin film having a thickness of 0.2 nm is repeatedly formed five times and then finally forms the thin film having a thickness of 1 nm with reducing process. The letter "C" represents the case of forming a thin film having a thickness of 2 nm sequentially and repeatedly.

As shown in Table 2, the productivity within a unit time varies depending on the time for removing the residual gases after the injection of gaseous reactants. Namely, as the time passes from 1 second to 14 seconds, the total time for one substrate increases from 200 seconds to 1500 seconds. This total time 1500 seconds is similar to the cased "A".

However, in the present invention, the thin film is formed under the control of the quantity and pressure of reducing gases and the time during the unit deposition cycle, and the impurities are removed repeatedly after a certain thickness of thin film is attained. Therefore, if the total consumption time is shortened, the quantity of impurities accumulated in the thin film can be reduced. Especially in the present invention, since the number of depositions and the exposing time to the reducing gases are variable depending on the thin film type, it is easy to attain the thin film characteristics and properties and the productivity of the thin film can increase.

Tables 4, 5 and 6 show productivity of a $Ta_2O_5$/TiN thin film within a unit time, which is used as a dielectric layer in the capacitor, in order to compare the method of the present invention with the conventional CVD and ALD methods. At this point, the $Ta_2O_5$ thin film has a thickness of 8 nm, and then the TiN thin film, as a barrier, is formed by a thickness of 25 nm after thermal-treating the $Ta_2O_5$ thin film.

TABLE 4

Conventional CVD Method

| Process | The time required (the number of substrate) | Total (productivity/substrates) |
|---|---|---|
| Deposition of $Ta_2O_5$ | 25 min./25 substrates (4 substrate-basis in the single-wafer system) | 3.0 hours/25 substrates |
| Horizontal furnace thermal treatment | 180 min. (150 substrates) | |
| Deposition of TiN | 120 min/25 substrates | |

TABLE 5

Conventional ALD Method

| Process | The time required (the number of substrate) | Total (productivity/substrates) |
|---|---|---|
| Deposition of $Ta_2O_5$ | 34 min./25 substrates (4 substrate-basis in the single-wafer system) | 2.0 hours/25 substrates |
| Horizontal furnace thermal treatment | 180 min. (150 substrates) | |
| Deposition of TiN | 53 min/25 substrates | |

TABLE 6

Present Invention

| Thin Film | Process | The time required (the number of substrate) | Total (productivity/substrates) |
|---|---|---|---|
| I | Deposition of $Ta_2O_5$ | 1 min./substrate (additional reducing gas process for 5.25 minutes) | 2.9 hours/25 substrates |
| | Vacuum furnace thermal treatment | 6.25 min./substrate ($O_2$ or $O_3$ atmosphere) | |
| | Deposition of TiN | 6.25 min/substrate | |
| II | Deposition of $Ta_2O_5$ | 5.4 min./substrate (additional reducing gas process for 5.25 minutes) | 3.7 hours/25 substrates |
| | Vacuum furnace thermal treatment | 8.4 min./substrate ($O_2$ or $O_3$ atmosphere) | |
| | Deposition of TiN | 8.4 min/substrate | |
| III | Deposition of $Ta_2O_5$ | 16 min./substrate | 6.7 hours/25 substrates |
| | Vacuum furnace thermal treatment | 16 min./substrate ($O_2$ or $O_3$ atmosphere) | |
| | Deposition of TiN | 8.4 min/substrate | |

According to the conventional CVD and ALD methods, since a deposition apparatus assembly is required in each process, the conventional CVD and ALD methods need three complex facilities. However, according to the present invention, the productivity shown in Table 6 is obtained throughout just one complex facility. Therefore, if the present invention uses three complex facilities, the productivity will increase as three times as the conventional CVD and ALD methods.

As more detailed explanation, for example, when the capacitor uses the above-mentioned $Ta_2O_5$ thin film, the polycrystalline silicon layer is formed on the $Ta_2O_5$ thin film. In this case, if the $Ta_2O_5$ thin film is formed using the method of the present invention, it is possible that the thermal treatment is executed in the same apparatus after forming the $Ta_2O_5$ thin film. Therefore, the polycrystalline silicon formed on the $Ta_2O_5$ thin film can be formed in the same apparatus. This method can be applied to the method of forming the alumina thin film as a dielectric layer of the capacitor and then forming a polycrystalline silicon on the alumina thin film.

The conventional ALD method has a better productivity than the conventional CVD method because it can be supposed that the deposition is executed for four seconds within one cycle by way of optimizing the apparatus and process. However, if barrier gases or residual gases are removed for a long time by the vacuum pump, the conventional ALD method will have a worse productivity than the conventional CVD method.

Accordingly in the present invention, the deposition process is performed to initially form the thin film by a certain thickness for the purpose of the penetration of reducing agent into the initially formed thin film. Therefore, the impurities can be removed by the repetition of applying the reducing gases into the circumstance of non-exposure. Furthermore, since the vacuum thermal treatment can be performed under the reducing gas circumstance, the thin film properties and characteristics can be improved although the crystallization and the density concentration occur.

It will be apparent to those skilled in the art that various modifications and variation can be made in the method of manufacturing a thin film of the present invention without departing from the spirit or scope of the invention. Thus, it is intended that the present invention covers the modifications and variations of this invention provided they come within the scope of the appended claims and their equivalents.

What is claimed is:

1. A method of fabricating a thin film using atomic layer deposition in a first chamber where a heater and a suscepter are located, the method comprising the steps of:
   disposing an object on the susceptor so as to form the thin film thereon;
   heating the object;
   a first sub-step of introducing a first gaseous reactant into the first chamber such that the first gaseous reactant is absorbed on the object to form an absorption layer;
   a second sub-step of introducing a second gaseous reactant into the first chamber sequentially after the first sub-step such that the second gaseous reactant reacts with the absorption layer absorbed on the object; and
   a third sub-step of introducing a reducing gas into the first chamber such that the reducing gas reduces by-products and impurities of the first and second gaseous reactants, said method further comprising:
   the step of thermal-treating the object in a second chamber after the third sub-step when the deposited thin film is used as a dielectric layer for the electric device, wherein no purging sub-step occurs between the first, second, and third sub-steps.

2. The method of claim 1, wherein the first, second and third sub-steps are sequentially repeated as one cycle so as to form the thin film having an ultra-high degree of purity.

3. The method of claim 2, wherein a thickness of the thin film having the ultra-high degree of purity is less than about 0.3 nm after performing the first and second sub-steps one time.

4. The method of claim 3, wherein the thin film having the ultra-high degree of purity is equal to or less than about 10 nm in thickness after final deposition process.

5. The method of claim 1, wherein three-time repetitions of the first and second sub-step and one time of the third sub-step form one cycle of deposition and several repetitions of one cycle form the thin film having a high degree of purity.

6. The method of claim 5, wherein a thickness of the thin film having the high degree of purity is about 1 nm after three-time repetitions of the first and second sub-steps.

7. The method of claim 6, wherein a thickness of the thin film having a high degree of purity ranges from about 0.2 to 0.3 nm after one time of the first and second sub-step.

8. The method of claim 7, wherein the thin film having a high degree of purity is less than about 10 nm in thickness after final deposition process.

9. The method of claim 1, wherein more than ten-time repetitions of the first and second sub-steps and one-time of the third sub-step form one cycle of deposition and several repetitions of one cycle form one of crystalline and amorphous thin films.

10. The method of claim 9, wherein a thickness of each of crystalline and amorphous thin films ranges from about 2 to 3 nm after one cycle of deposition.

11. The method of claim 9, wherein each of crystalline and amorphous thin films is more than about 10 nm in thickness after final deposition process.

12. The method of claim 9, wherein a thickness of each of the crystalline and amorphous thin films ranges from about 0.2 to 0.3 nm after performing the first and second sub-steps one time.

13. The method of claim 1, wherein the first and second sub-steps form an oxidized layer and the reducing gas is one of oxygen and ozone.

14. The method of claim 1, wherein the first and second sub-steps form a nitride layer and the reducing gas is one of ammonia and hydrazine.

15. The method of claim 1, wherein the second chamber is a vacuum chamber and the reducing gas of the third sub-step is introduced in the second chamber.

16. The method of claim 15, wherein the reducing gas introduced in the second chamber is excited into a plasma during the thermal treatment for the dielectric layer.

17. The method of claim 16, wherein the dielectric layer is one of alumina thin film and tantalum pentoxide ($Ta_2O_5$) thin film.

18. The method of claim 17, further comprising the step of forming a polycrystalline silicon layer on each of alumina thin film and tantalum pentoxide ($Ta_2O_5$) thin film.

19. The method of claim 18, wherein forming one of alumina thin film and tantalum pentoxide ($Ta_2O_5$) thin film and forming the polycrystalline silicon layer are sequentially performed in the first and second chamber.

* * * * *

UNITED STATES PATENT AND TRADEMARK OFFICE
CERTIFICATE OF CORRECTION

PATENT NO. : 6,723,595 B2
DATED : April 20, 2004
INVENTOR(S) : Chang-Soo Park

It is certified that error appears in the above-identified patent and that said Letters Patent is hereby corrected as shown below:

<u>Title page,</u>
Item [75], Inventor, delete "Chang-Boo Park," and insert therefor -- Chang-Soo Park --.

Signed and Sealed this

Fourth Day of January, 2005

JON W. DUDAS
*Director of the United States Patent and Trademark Office*